(12) United States Patent
Shin et al.

(10) Patent No.: US 11,860,410 B2
(45) Date of Patent: Jan. 2, 2024

(54) PHOTONIC INTEGRATED CIRCUIT PLATFORM AND OPTICAL PHASE ARRAY DEVICE USING THE SAME

(71) Applicant: SAMSUNG ELECTRONICS CO., LTD., Suwon-si (KR)

(72) Inventors: Dongjae Shin, Seoul (KR); Dongsik Shim, Hwaseong-si (KR); Eunkyung Lee, Seoul (KR); Changbum Lee, Seoul (KR); Bongyong Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 414 days.

(21) Appl. No.: 17/023,631

(22) Filed: Sep. 17, 2020

(65) Prior Publication Data

US 2021/0364695 A1 Nov. 25, 2021

(30) Foreign Application Priority Data

May 20, 2020 (KR) .................... 10-2020-0060618

(51) Int. Cl.
  *G02B 6/12* (2006.01)
  *G02B 6/136* (2006.01)
  (Continued)

(52) U.S. Cl.
  CPC ......... *G02B 6/12004* (2013.01); *G02B 6/125* (2013.01); *G02B 6/12007* (2013.01);
  (Continued)

(58) Field of Classification Search
  None
  See application file for complete search history.

(56) References Cited

U.S. PATENT DOCUMENTS 9,341,776 B2  5/2016 Iizuka et al.
9,461,441 B2  10/2016 Chantre et al.
(Continued)

FOREIGN PATENT DOCUMENTS

JP  2016-156933 A  9/2016

OTHER PUBLICATIONS

Quentin Wilmart et al., "A Versatile Silicon-Silicon Nitride Photonics Platform for Enhanced Functionalities and Applications", applied sciences, 9, 255; doi:10.3390, 2019, pp. 1-16, 16 pages total.

*Primary Examiner* — Chad H Smith
(74) *Attorney, Agent, or Firm* — Sughrue Mion, PLLC

(57) ABSTRACT

A photonic integrated circuit platform includes a substrate, a first oxide layer disposed on the substrate and including an insulating transparent oxide, and a first optical element layer disposed on the first oxide layer and including a semiconductor material. The photonic integrated circuit platform further includes a second optical element layer disposed on the first optical element layer and including an insulating material different from the insulating transparent oxide of the first oxide layer, the second optical element layer further including a compound semiconductor material different from the semiconductor material of the first optical element layer, a second oxide layer disposed on the second optical element layer and including an insulating transparent oxide, and a plurality of optical elements formed by patterning the first optical element layer or the second optical element layer.

22 Claims, 15 Drawing Sheets

(51) Int. Cl.
*G02B 6/125* (2006.01)
*G02B 6/293* (2006.01)

(52) U.S. Cl.
CPC .......... *G02B 6/136* (2013.01); *G02B 6/29301* (2013.01); *G02B 2006/12128* (2013.01)

(56) References Cited

U.S. PATENT DOCUMENTS

| | | |
|---|---|---|
| 9,612,398 B2 | 4/2017 | Vurgaftman et al. |
| 9,740,079 B1 * | 8/2017 | Davids ................ G02B 6/1347 |
| 2016/0109655 A1 | 4/2016 | Vurgaftman et al. |
| 2016/0233641 A1 | 8/2016 | Chantre et al. |
| 2019/0101711 A1 * | 4/2019 | Van Campenhout .... G02B 6/13 |

* cited by examiner

FIG. 3A

| QW OCF (Ch, NSCH50nm) | | | | | |
|---|---|---|---|---|---|
| H | W0.5 | W0.75 | W1 | W1.25 | W1.5 |
| 200 | 12.2 | 12 | 11.5 | 11.1 | 10.8 |
| 300 | 12.1 | 10 | 7.6 | 6.4 | 5.9 |
| 400 | 11.9 | 5.7 | 3.2 | 2.5 | 2.3 |
| 500 | 11.6 | 2.6 | 1.4 | 1.1 | 1 |
| 600 | 3.2 | 1 | 0.7 | 0.6 | 0.5 |
| 700 | 1.5 | 0.5 | 0.4 | 0.4 | 0.3 |

FIG. 3B

| Si OCF (Ch. NSCH50nm) | | | | | |
|---|---|---|---|---|---|
| H | W0.5 | W0.75 | W1 | W1.25 | W1.5 |
| 200 | 1 | 4.7 | 8.9 | 11.8 | 13.7 |
| 300 | 2.3 | 19.4 | 35.7 | 42.8 | 46.1 |
| 400 | 4.4 | 50.1 | 66.9 | 71.2 | 72.9 |
| 500 | 7.3 | 73.7 | 82.2 | 84.2 | 85 |
| 600 | 64.8 | 85 | 89.2 | 90.3 | 90.7 |
| 700 | 79.5 | 90.7 | 92.9 | 93.6 | 93.8 |

FIG. 4A

| QW OCF (Rib, NSCH0nm) | | | | | |
|---|---|---|---|---|---|
| H | W0.5 | W0.75 | W1 | W1.25 | W1.5 |
| 200 | 12.3 | 12.4 | 12.1 | 11.9 | 11.7 |
| 300 | 12 | 9.6 | 8 | 7.3 | 6.9 |
| 400 | 10.4 | 5 | 3.8 | 3.4 | 3.2 |
| 500 | 5.8 | 2.3 | 1.8 | 1.7 | 1.6 |
| 600 | 1.6 | 1.1 | 1 | 0.9 | 0.9 |
| 700 | 0.4 | 0.6 | 0.6 | 0.6 | 0.6 |

FIG. 4B

| Si OCF (Rib, NSCH0nm) | | | | | |
|---|---|---|---|---|---|
| H | W0.5 | W0.75 | W1 | W1.25 | W1.5 |
| 200 | 2.8 | 8.7 | 13.4 | 16.1 | 17.6 |
| 300 | 8 | 31 | 42.1 | 46.4 | 48.4 |
| 400 | 21.7 | 61.7 | 69 | 71.4 | 72.3 |
| 500 | 55.7 | 80.3 | 82.9 | 83.8 | 84.2 |
| 600 | 84.7 | 89.1 | 89.7 | 90.1 | 90.2 |
| 700 | 93.7 | 93.5 | 93.4 | 93.5 | 93.5 |

FIG. 5A

| QW OCF (Rib, NSCH100nm) | | | | | |
|---|---|---|---|---|---|
| H | W0.5 | W0.75 | W1 | W1.25 | W1.5 |
| 200 | 12.5 | 12.1 | 11.6 | 11.2 | 10.9 |
| 300 | 12.3 | 9.7 | 7.1 | 5.9 | 5.3 |
| 400 | 11.6 | 4 | 2.3 | 1.8 | 1.7 |
| 500 | 8.1 | 1.2 | 0.8 | 0.7 | 0.6 |
| 600 | 1.4 | 0.5 | 0.4 | 0.3 | 0.3 |
| 700 | 0.2 | 0.2 | 0.2 | 0.2 | 0.2 |

FIG. 5B

| Si OCF (Rib, NSCH100nm) | | | | | |
|---|---|---|---|---|---|
| H | W0.5 | W0.75 | W1 | W1.25 | W1.5 |
| 200 | 0.9 | 3.6 | 6.7 | 9.1 | 10.6 |
| 300 | 2.5 | 18.9 | 34.5 | 41.7 | 45 |
| 400 | 7.4 | 58.5 | 70 | 73.1 | 74.3 |
| 500 | 33.1 | 81.8 | 84.8 | 85.8 | 86.1 |
| 600 | 83.2 | 90.5 | 91.1 | 91.4 | 91.5 |
| 700 | 94.1 | 94.4 | 94.3 | 94.4 | 94.4 |

PHOTONIC INTEGRATED CIRCUIT PLATFORM AND OPTICAL PHASE ARRAY DEVICE USING THE SAME

CROSS-REFERENCE TO RELATED APPLICATION

This application claims the benefit of Korean Patent Application No. 10-2020-0060618, filed on May 20, 2020, in the Korean Intellectual Property Office, the disclosure of which is incorporated herein in its entirety by reference.

BACKGROUND

1. Field

The disclosure relates to photonic integrated circuit platforms for manufacturing an optical integrated circuit in which various optical elements are integrated and optical phase array elements using the same, and more particularly, to photonic integrated circuit platforms having high heat dissipation efficiency and low optical loss and optical phased array devices using the same.

2. Description of Related Art

Recently, an optical integrated circuit (PIC) in which optical elements are integrated has been used in various optical sensors or optical connection fields. Optical elements used in an optical integrated circuit include, for example, a light source that converts electrical energy into optical energy, an optical modulator that modulates light, an optical waveguide that transmits an optical signal, an optical antenna or an optical coupler that emits light inside the optical waveguide to the outside of an optical integrated circuit chip or receives light outside the optical integrated circuit chip into the optical waveguide inside, and optical receiver that converts light energy into electrical energy. Most of these optical elements integrated in the optical integrated circuit include materials that are easy to form on a substrate.

SUMMARY

Provided are photonic integrated circuit platforms capable of manufacturing an optical integrated circuit having high heat dissipation efficiency and low optical loss.

Provided are optical phased array devices using the photonic integrated circuit platforms.

Additional aspects will be set forth in part in the description that follows and, in part, will be apparent from the description, or may be learned by practice of the presented embodiments of the disclosure.

According to embodiments, a photonic integrated circuit platform includes a substrate, a first oxide layer disposed on the substrate and including an insulating transparent oxide, a first optical element layer disposed on the first oxide layer and including a semiconductor material, a second optical element layer disposed on the first optical element layer and including an insulating material different from the insulating transparent oxide of the first oxide layer, the second optical element layer further including a compound semiconductor material different from the semiconductor material of the first optical element layer, a second oxide layer disposed on the second optical element layer and including an insulating transparent oxide, and a plurality of optical elements formed by patterning the first optical element layer or the second optical element layer.

The substrate may include silicon, the insulating transparent oxide of the first oxide layer may include silicon oxide stacked over an entire upper surface of the substrate, the semiconductor material of the first optical element layer may include silicon, and the insulating material of the second optical element layer may include silicon nitride.

The substrate may include a bulk silicon substrate, and the insulating transparent oxide of the first oxide layer may include silicon oxide locally disposed on the substrate so that the silicon oxide faces a lower part of one among the plurality of optical elements that is disposed in the first optical element layer.

The photonic integrated circuit platform may further include a third optical element layer including at least one optical element including silicon nitride and disposed inside the first oxide layer.

The at least one optical element may include an optical waveguide and an optical coupler that are disposed under the first optical element layer.

The plurality of optical elements may include any one or any combination of a light source, an optical amplifier, an optical modulator, an optical waveguide, an optical coupler, and a photodetector.

The light source or the optical amplifier may include an optical waveguide formed by patterning the semiconductor material of the first optical element layer, a compound semiconductor layer formed by patterning the compound semiconductor material of the second optical element layer on the optical waveguide; and conductive plugs disposed vertically through the second oxide layer.

The light source or the optical amplifier may further include an upper clad disposed to surround an upper portion of the compound semiconductor layer, and the upper clad includes the insulating material of the second optical element layer.

The semiconductor material of the first optical element layer may have a thickness in a range from about 150 nm to about 1,000 nm, and the optical waveguide may be formed by partially etching and patterning 1% to 80% of the thickness of the semiconductor material.

A distance between the semiconductor material of the first optical element layer and the compound semiconductor layer of the second optical element layer may in be a range from about 0 nm to about 10 nm.

The optical waveguide may include a first optical waveguide formed by patterning the semiconductor material of the first optical element layer, and a second optical waveguide formed by patterning the insulating material of the second optical element layer.

A thickness of the insulating material of the second optical element layer forming the second optical waveguide may be in a range from about 150 nm to about 1,000 nm, and the second optical waveguide may be formed by partially etching and patterning 1% to 80% of the thickness of the insulating material of the second optical element layer.

In a top view of the photonic integrated circuit platform, a portion of the first optical waveguide may overlap a portion of the second optical waveguide, a distance between the first optical waveguide and the second optical waveguide may be in a range from about 0 nm to about 200 nm so that a vertical evanescent coupling occurs in a region where the first optical waveguide and the second optical waveguide face each other, and the insulating transparent oxide of the first oxide layer may be filled between the first optical waveguide and the second optical waveguide.

The optical coupler may include a form of a periodic grating formed by patterning the insulating material of the second optical element layer, and is integrally formed with the second optical waveguide.

The photodetector may include an optical waveguide formed by patterning the semiconductor material of the first optical element layer, a compound semiconductor layer formed by patterning the compound semiconductor material of the second optical element layer on the optical waveguide, and conductive plugs disposed vertically through the second oxide layer, and the compound semiconductor layer of the light source or the optical amplifier, the second optical waveguide, the optical coupler, and the compound semiconductor layer of the photodetector may be disposed at a same layer height in the second optical element layer.

The photodetector may include a first doping region formed by doping the semiconductor material of the first optical element layer, a germanium layer including germanium (Ge) in the second optical element layer on the first doping region, and a second doping region formed by doping the germanium layer.

The photodetector may further include a SiGe layer including a mixture of silicon (Si) and germanium (Ge) at an interface between a lower surface of the germanium layer and the first doping region.

The compound semiconductor layer of the light source or the optical amplifier, the second optical waveguide, the optical coupler, and the germanium layer of the photodetector may be disposed at a same layer height in the second optical element layer.

According to embodiments, an optical phased array device includes a substrate, a first oxide layer disposed on the substrate and including an insulating transparent oxide, a first optical element layer disposed on the first oxide layer, a second optical element layer disposed on the first optical element layer, and a second oxide layer disposed on the second optical element layer. The first optical element layer includes an optical waveguide including a semiconductor material, a branch region for splitting one light traveling along the optical waveguide, into pieces of light, and a phase control region for independently controlling phases of the split pieces of light, and the second optical element layer includes a light source including a compound semiconductor material different from the semiconductor material of the first optical element layer, an amplifying region for amplifying a magnitude of an optical signal, and an emission region for emitting the optical signal of which the magnitude is amplified.

The optical phased array device may be configured to sequentially transmit light that is generated from the light source through the branch region, the phase control region, the amplifying region, and the emission region along the optical waveguide.

The branch region may include a plurality of optical splitters, and each of the plurality of optical splitters may include an input terminal connected to one optical waveguide, and an output terminal connected to a plurality of optical waveguides.

The phase control region may include a plurality of phase control elements that is disposed in a direction perpendicular to a traveling direction of the light, and the plurality of phase control elements may independently control a phase of the light.

The emission region may include a plurality of grating pattern groups including an insulating material different from the insulating transparent oxide of the first oxide layer, and the plurality of grating pattern groups may be disposed in a direction perpendicular to a travelling direction of the light.

In a top view of the optical phased array device, a portion of the optical waveguide may overlap a portion of the plurality of grating pattern groups, and a distance between the optical waveguide and the plurality of grating pattern groups may be in a range from about 0 to about 200 nm so that a vertical evanescent coupling occurs in a region where the optical waveguide and the plurality of grating pattern groups face each other.

BRIEF DESCRIPTION OF THE DRAWINGS

The above and other aspects, features, and advantages of embodiments of the disclosure will be more apparent from the following description taken in conjunction with the accompanying drawings, in which:

FIGS. 3A and 3B are tables respectively showing optical confinement factors in a compound semiconductor layer and optical confinement factors in an optical waveguide when an optical waveguide disposed under a light source or an optical amplifier is a channel waveguide and the compound semiconductor layer of the light source or the optical amplifier has an n-type separate confinement heterostructure (NSCH) having a thickness of 50 nm;

FIGS. 4A and 4B are tables respectively showing optical confinement factors in a compound semiconductor layer and optical confinement factors in an optical waveguide when an optical waveguide disposed under a light source or an optical amplifier is a rib waveguide and the compound semiconductor layer of the light source or the optical amplifier does not have an NSCH;

FIGS. 5A and 5B are tables respectively showing optical confinement factors in a compound semiconductor layer and optical confinement factors in an optical waveguide when an optical waveguide disposed under a light source or an optical amplifier is a rib waveguide and the compound semiconductor layer of the light source or the optical amplifier has an NSCH having a thickness of 100 nm;

DETAILED DESCRIPTION

Figure 1:
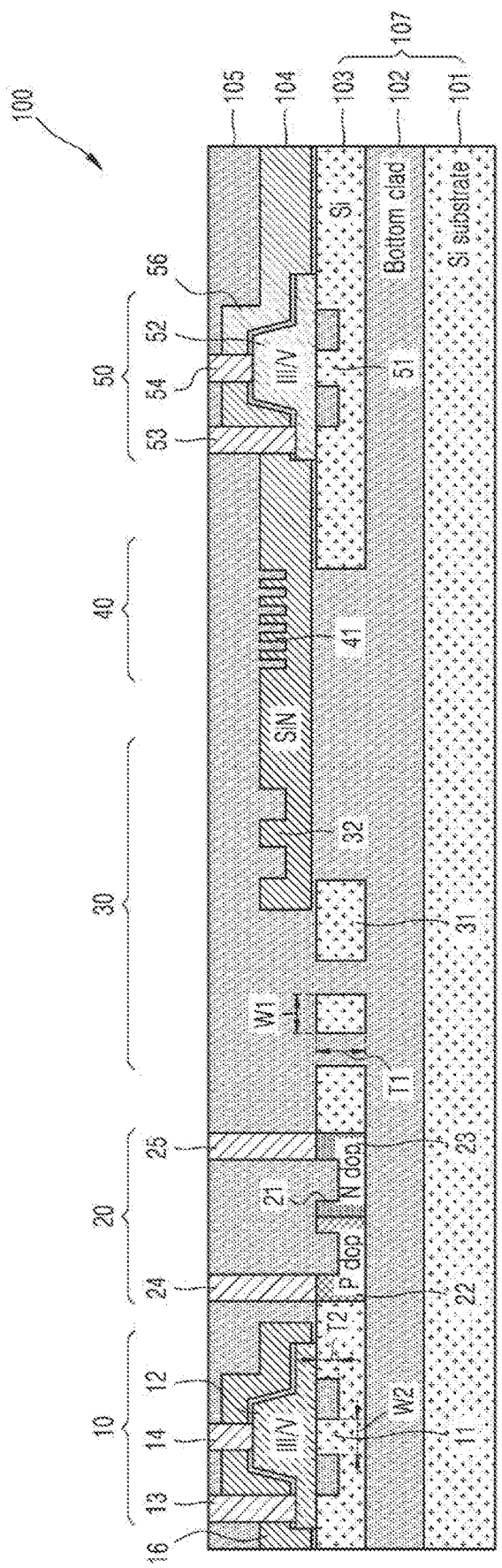
FIG. 1 is a schematic cross-sectional view of an example configuration of a photonic integrated circuit platform and an optical integrated circuit, according to embodiments.

Reference will now be made in detail to embodiments, examples of which are illustrated in the accompanying drawings, wherein like reference numerals refer to like elements throughout. In this regard, the present embodiments may have different forms and may not be construed as being limited to the descriptions set forth herein. Accordingly, the embodiments are described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, photonic integrated circuit platforms and optical phased array devices using the same will now be made in detail with reference to the accompanying drawings. In the drawings, like reference numerals denote like elements and sizes of constituent elements may be exaggerated for convenience of explanation and clarity. The embodiments of the inventive concept are capable of various modifications and may be embodied in many different forms.

It will be understood that when an element or layer is referred to as being "on" or "above" another element or layer, the element or layer may be directly on another element or layer or intervening elements or layers. Singular forms are intended to include the plural forms as well, unless the context clearly indicates otherwise. It may be understood that, when a part "comprises" or "includes" an element in the specification, unless otherwise defined, it is not excluding other elements but may further include other elements.

In the specification, the term "above" and similar directional terms may be applied to both singular and plural. With respect to operations that constitute a method, the operations may be performed in any appropriate sequence unless the sequence of operations is clearly described or unless the context clearly indicates otherwise. The operations may not necessarily be performed in the order of sequence.

Also, in the specification, the term "units" or " . . . modules" denote units or modules that process at least one function or operation, and may be realized by hardware, software, or a combination of hardware and software.

Connections or connection members of lines between components shown in the drawings illustrate functional connections and/or physical or circuit connections, and the connections or connection members can be represented by replaceable or additional various functional connections, physical connections, or circuit connections in an actual apparatus.

The use of any and all examples, or exemplary language provided herein, is intended to better illuminate the inventive concept and does not pose a limitation on the scope of the inventive concept unless otherwise claimed.

FIG. 1 is a schematic cross-sectional view of an example configuration of a photonic integrated circuit platform 100 and an optical integrated circuit, according to embodiments. Referring to FIG. 1, the photonic integrated circuit platform 100 according to an embodiment may include: a substrate 101; a first oxide layer 102 disposed on the substrate 101 and including an oxide material; a first optical element layer 103 disposed on the first oxide layer 102 and including a semiconductor material; a second optical element layer 104 disposed on the first optical element layer 103 and including a material different from the material included in the first oxide layer 102 and the material included in the first optical element layer 103; and a second oxide layer 105 disposed on the second optical element layer 104 and including an oxide material.

The substrate 101 may include, for example, a silicon (Si) substrate. However, the material of the substrate 101 is not necessarily limited to silicon, and various wafer materials used in the semiconductor manufacturing process may be used as the substrate 101.

The first oxide layer 102 including a transparent insulating oxide may be stacked over an entire upper surface of the substrate 101 and may act as a lower clad with respect to the first optical element layer 103. The transparent insulating oxide included in the first oxide layer 102 may be, for example, silicon oxide ($SiO_2$), but is not limited thereto. For example, the oxide material of the first oxide layer 102 may include any material having a lower refractive index than the material used as an optical element in the first optical element layer 103.

The first optical element layer 103 is a layer for implementing an optical element that is electrically operated. To this end, the first optical element layer 103 may include a semiconductor material. For example, the first optical element layer 103 may include crystalline silicon (c-Si). In this case, the substrate 101, the first oxide layer 102, and the first optical element layer 103 may be formed of, for example, one Si on Insulator (SOI) substrate 107. To implement an optical element through which a current flows, some regions of the first optical element layer 103 may be patterned through etching or doped with an impurity. In addition, an optical waveguide through which light emitted from an electrically operated optical element or light incident on an electrically operated optical element may proceed may further be formed by patterning some other regions of the first optical element layer 103. Spaces formed by removing the material of the first optical element layer 103 by etching may be filled with an oxide material constituting the first oxide layer 102.

The second optical element layer 104 may include an insulating material different from the oxide of the first oxide layer 102. The second optical element layer 104 may include an insulating material having less light loss and higher thermal conductivity than the oxide of the first oxide layer 102. For example, the insulating material included in the second optical element layer 104 may include silicon nitride (SiN). The silicon nitride of the second optical element layer 104 may implement an optical element to which no current is applied. For example, silicon nitride of the second optical element layer 104 may be used as an optical waveguide through which light may travel or may be used as a clad of an electrically operating optical element.

Also, the second optical element layer 104 may further include a semiconductor material different from the semiconductor material of the first optical element layer 103. For example, the second optical element layer 104 may include a Group III/V compound semiconductor, a group II/VI compound semiconductor, or germanium (Ge). The semiconductor material of the second optical element layer 104 may constitute, for example, an active layer of an electrically operating optical element.

The silicon nitride and the semiconductor material of the second optical element layer 104 may be patterned in various forms through etching to form a plurality of optical elements. Spaces formed by removing the silicon nitride and the semiconductor material of the second optical element layer 104 by etching may be filled with an oxide material constituting the first oxide layer 102.

The second oxide layer 105 may include the same transparent insulating oxide as the first oxide layer 102. For example, the second oxide layer 105 may include silicon oxide ($SiO_2$), but is not limited thereto. The second oxide layer 105 may be disposed to completely cover the first optical element layer 103 and the second optical element layer 104. The second oxide layer 105 may act as a top clad with respect to the first optical element layer 103 and the second optical element layer 104, and may act as a protective layer to protect optical elements formed in the first optical element layer 103 and the second optical element layer 104. Also, the second oxide layer 105 may perform as a planarization layer having a flat upper surface.

When the photonic integrated circuit platform 100 shown in FIG. 1 is used, optical integrated circuits having various structures and uses may be easily manufactured by forming various optical elements on the first optical element layer 103 and the second optical element layer 104 as necessary. In FIG. 1, as examples of various optical elements constituting an optical integrated circuit, a light source or an optical amplifier 10, an optical modulator 20, an optical waveguide 30, an optical coupler 40, and a photodetector 50 formed on the first optical element layer 103 and the second optical element layer 104 are shown. However, an optical integrated circuit that is actually implemented does not need to include all of these optical elements, and may include only some of the optical elements or may further include other types of optical elements depending on the use. In FIG. 1, only one light source or the optical amplifier 10, one optical modulator 20, one optical waveguide 30, one optical coupler 40, and one photodetector 50 respectively are depicted, but an optical integrated circuit that is actually implemented may include a plurality of identical optical elements as necessary. Also, the positions of the light source or the optical amplifier 10, the optical modulator 20, the optical waveguide 30, the optical coupler 40, and the photodetector 50 may vary depending on the optical integrated circuit that is actually implemented. FIG. 1 does not show an example of an optical integrated circuit designed to perform a function, it is an example of various optical elements that may be formed on the photonic integrated circuit platform 100.

The light source or the optical amplifier 10 may include, for example, an optical waveguide 11 on the first optical element layer 103, a compound semiconductor layer 12 on the second optical element layer 104, conductive plugs 13 and 14 vertically formed through the second oxide layer 105, and an upper clad 16 formed in the second optical element layer 104 to surround an upper portion of the compound semiconductor layer 12.

The optical waveguide 11 may be formed by partially patterning silicon of the first optical element layer 103. The optical waveguide 11 may provide light to the compound semiconductor layer 12 formed thereon or extract light generated from the compound semiconductor layer 12. The thickness of silicon of the first optical element layer 103 may be in a range from about 150 nm to about 1,000 nm, and the optical waveguide 11 may be formed by partially etching and patterning about 1% to about 80% of the total thickness of silicon.

The compound semiconductor layer 12 may include a Group III/V compound semiconductor or a group II/VI compound semiconductor, and may include a multiple quantum well (MQW) including a plurality of barriers and a plurality of quantum wells alternately arranged in a vertical direction. The compound semiconductor layer 12 may have a thickness in a range from about 500 nm to about 3,000 nm. Also, the compound semiconductor layer 12 may be patterned in a ridge form by etching both edges of the compound semiconductor layer 12 about 1% to about 80% of the total thickness.

The upper clad 16 including silicon nitride may confine light in the compound semiconductor layer 12, and at the same time, may emit heat generated from the compound semiconductor layer 12 to the outside. In FIG. 1, it is depicted that there is a gap between the upper clad 16 and the compound semiconductor layer 12, and the gap is filled with an oxide material, but the upper clad 16 may directly contact the compound semiconductor layer 12. The upper clad 16 may have a thickness in a range from about 150 nm to about 1,000 nm.

In FIG. 1, it is depicted that the silicon of the first optical element layer 103 and the compound semiconductor layer 12 of the second optical element layer 104 are in direct contact with each other. However, in the process of forming the light source or the optical amplifier 10, an oxide material may be intervened between the silicon of the first optical element layer 103 and the compound semiconductor layer 12 of the second optical element layer 104. In this case, there may be a slight gap between the silicon of the first optical element layer 103 and the compound semiconductor layer 12 of the second optical element layer 104, and an oxide material may fill the gap. For example, the gap between the silicon of the first optical element layer 103 and the compound semiconductor layer 12 of the second optical element layer 104 or the thickness of the oxide material may be in a range from about 0 nm to about 10 nm.

The optical modulator 20 changes the intensity or phase of incident light and may be formed by doping the silicon of the first optical element layer 103. For example, the optical modulator 20 may include an optical waveguide 21 formed by patterning silicon of the first optical element layer 103, first and second doping regions 22 and 23 formed by doping silicon of the first optical element layer 103 with an impurity, and conductive plugs 24 and 25 formed by vertically penetrating through the second oxide layer 105. The first doping region 22 and the second doping region 23 may be doped to have opposite electrical characteristics to each other. For example, the first doping region 22 may be doped in a p-type and the second doping region 23 may be doped in an n-type, or the first doping region 22 may be doped in an n-type and the second doping region 23 may be doped in a p-type. One of the conductive plugs 24 and 25 may be electrically connected to the first doping region 22 and the other to the second doping region 23. In FIG. 1, for convenience, it is depicted that the optical modulator 20 is formed of only the first optical element layer 103, but the optical modulator 20 may be formed of a compound semiconductor of the second optical element layer 104 like the light source or the optical amplifier 10.

The optical waveguide 30 may include a first optical waveguide 31 formed by patterning silicon of the first optical element layer 103 and a second optical waveguide 32 formed by patterning silicon nitride of the second optical element layer 104. The first optical waveguide 31 and the second optical waveguide 32 may transmit light between the light source or the optical amplifier 10, the optical modulator 20, the optical coupler 40, and the photodetector 50. The thickness of the silicon forming the first optical waveguide 31 and the thickness of the silicon nitride forming the second optical waveguide 32 may be in a range from about 150 nm to about 1,000 nm.

In FIG. 1, the first optical waveguide 31 formed in the first optical element layer 103 is a channel waveguide having a pattern completely through the first optical element layer 103 in a thickness direction of the first optical element layer 103, and the second optical waveguide 32 formed in the second optical element layer 104 is a rib waveguide having a pattern partially etched in the thickness direction of the second optical element layer 104, but the present embodiment is not limited thereto. For example, the first optical waveguide 31 formed in the first optical element layer 103 may be a rib waveguide, and the second optical waveguide 32 formed in the second optical element layer 104 may be a channel waveguide. In the rib waveguide, a partial etch depth may be in a range from about 1% to about 80% of the total thickness. For example, when the second optical waveguide 32 is a rib waveguide, the partial etch depth of silicon nitride may be in a range from about 1% to about 80% of the total thickness of silicon nitride.

The second optical waveguide 32 formed in the second optical element layer 104 is disposed above the first optical waveguide 31 formed in the first optical element layer 103. For optical connection between the first optical waveguide 31 and the second optical waveguide 32, in the top view of the photonic integrated circuit platform 100, a portion of the first optical waveguide 31 and a portion of the second optical waveguide 32 may be disposed to overlap each other. If a gap between the first optical waveguide 31 and the second optical waveguide 32 in the thickness direction is less than or equal to a wavelength of light, a vertical evanescent coupling occurs in regions where the first optical waveguide 31 and the second optical waveguide 32 face each other, and thus, light may be transmitted between the first optical waveguide 31 and the second optical waveguide 32 with almost no optical loss. For example, the distance between the first optical waveguide 31 and the second optical waveguide 32 in the thickness direction is in a range from about 0 nm to about 200 nm. In addition, the gap between the first optical waveguide 31 and the second optical waveguide 32 may be filled with an oxide material constituting the first oxide layer 102.

The optical coupler 40 may be configured to receive light outside the optical integrated circuit into the optical waveguide 30 or emit light inside the optical waveguide 30 to the outside of the optical integrated circuit. For example, the optical coupler 40 may have the form of a periodic grating 41. As shown in FIG. 1, the optical coupler 40 may be integrally formed with the second optical waveguide 32 by patterning the silicon nitride of the second optical element layer 104.

The photodetector 50 may include, for example, an optical waveguide 51 on the first optical element layer 103, a compound semiconductor layer 52 on the second optical element layer 104, conductive plugs 53 and 54 formed by vertically penetrating through the second oxide layer 105, and an upper clad 56 in the second optical element layer 104 to surround an upper portion of the compound semiconductor layer 52. The optical waveguide 51 may be formed by partially patterning silicon of the first optical element layer 103. The compound semiconductor layer 52 may include a Group III/V compound semiconductor or a group II/VI compound semiconductor. Also, the compound semiconductor layer 52 may be patterned in a ridge shape by etching both edges of the compound semiconductor layer 52. The upper clad 56 may confine light in the compound semiconductor layer 52, and at the same time, may emit heat generated from the compound semiconductor layer 52 to the outside. The upper clad 56 may include silicon nitride.

The compound semiconductor layer 12 of the light source or the optical amplifier 10, the second optical waveguide 32 of the optical waveguide 30, the optical coupler 40, and the compound semiconductor layer 52 of the photodetector 50 may be disposed at the same layer height in the second optical element layer 104. Here, the compound semiconductor layer 12 and the compound semiconductor layer 52 may include the same compound semiconductor material, and the second optical waveguide 32 and the optical coupler 40 may include the same silicon nitride material.

As described above, when the photonic integrated circuit platform 100 according to the present embodiment is used, an optical integrated circuit including optical elements including various materials may be conveniently manufactured. Accordingly, the performance of various optical elements of the optical integrated circuit may be improved. For example, silicon nitride disposed on the second optical element layer 104 has optical loss less than silicon disposed on the first optical element layer 103, and has thermal conductivity greater than silicon oxide disposed on the first and second oxide layers 102 and 105. For example, the thermal conductivity of silicon nitride ($Si_3N_4$) is in a range from about 10 W/(m*K) to about 43 W/(m*K), and the thermal conductivity of silicon oxide ($SiO_2$) is in a range from about 1.3 W/(m*K) to about 1.5 W/(m*K).

Because the optical waveguide 30 and the optical coupler 40 include a material having less light loss than the materials of the substrate 101 and the first optical element layer 103, and the upper clads 16 and 56 on the compound semiconductor layers 12 and 52 include a material having a greater heat dissipation efficiency than the materials of the first and second oxide layers 102 and 105, the optical loss of the optical integrated circuit may be reduced, the exothermic optical elements in the optical integrated circuit may be effectively cooled, and the deterioration of the performance of optical elements that are sensitive to heat may be prevented.

Also, when the photonic integrated circuit platform according to the present embodiment is used, an optical integrated circuit including various optical elements including different materials may be manufactured through a single process. Accordingly, a subsequent process in which some optical elements are separately manufactured and assembled into the optical integrated circuit is not required.

The optical integrated circuit may be applied to various fields. For example, the optical integrated circuit may be applied to a Light Detection and Ranging (LiDAR) sensor for autonomous driving and an optical connection device for a data center.

Figure 2:
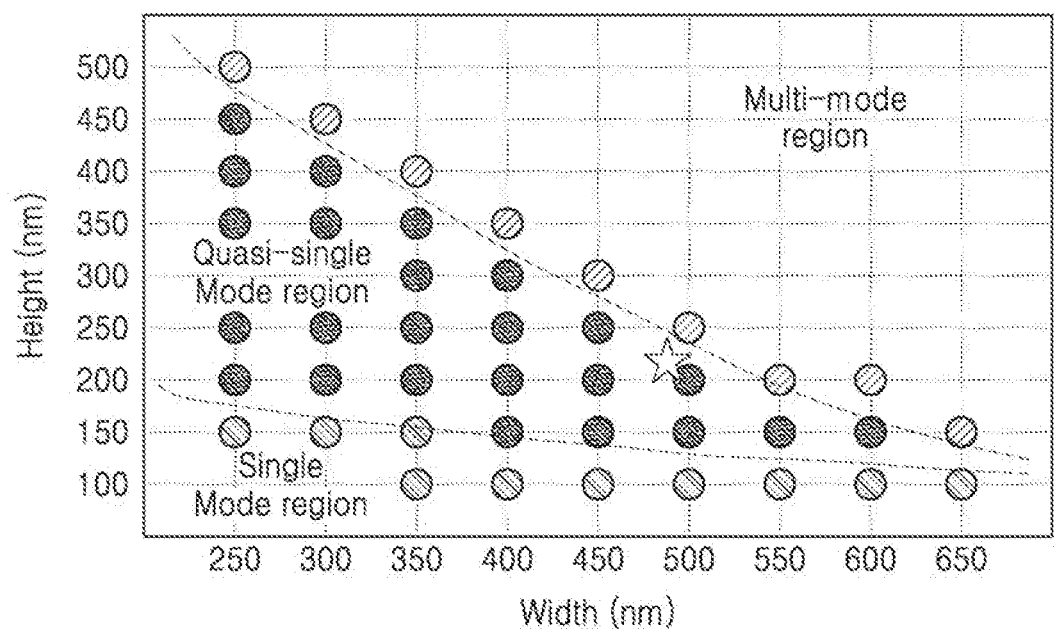
FIG. 2 is a graph showing mode characteristics of a first optical waveguide according to a width and a height of the first optical waveguide of a first optical element layer shown in FIG. 1.

Moreover, a width W1 and a height T1 of the first optical waveguide 31 of the first optical element layer 103 including silicon may be determined to satisfy a single mode condition. For example, FIG. 2 is a graph showing mode characteristics of the first optical waveguide 31 according to the width and the height of the first optical waveguide 31 of the first optical element layer 103 shown in FIG. 1. Referring to the graph of FIG. 2, the first optical waveguide 31 including silicon may be operated in a multi-mode, a semi-single mode, or a single mode according to the width W1 and the height T1 thereof. In the semi-single mode, there is one TE mode and one TM mode, and in the single mode, there is only one TE mode. Based on the graph of FIG. 2, the width W1 and the height T1 of the first optical waveguide 31 may be selected so that the first optical waveguide 31 of the first optical element layer 103 satisfies at least a semi-single mode. For example, when the width W1 of the first optical waveguide 31 is about 250 nm, the height T1 of the first optical waveguide 31 may be selected to be about 500 nm or less. Also, when the width W1 of the first optical waveguide 31 is about 650 nm or more, the height T1 of the first optical waveguide 31 can be selected to be about 150 nm or less. Accordingly, as the width W1 of the first optical waveguide 31 increases, the height T1 of the first optical waveguide 31 may decrease, and as the width W1 of the first optical waveguide 31 decreases, the height T1 of the first optical waveguide 31 may increase.

Also, a high light efficiency may be obtained when light generated from the light source or the optical amplifier 10 is properly distributed to the compound semiconductor layer 12 and the optical waveguide 11 thereunder. For example, a width W2 and a height T2 of the optical waveguide 11 may be selected so that about a half of light energy is distributed in the compound semiconductor layer 12 and the other half of the light energy is distributed in the optical waveguide 11. The optimal width W2 and the height T2 of the optical waveguide 11 may vary depending on internal structures of the compound semiconductor layer 12 and the optical waveguide 11. The width W2 and the height T2 of the optical waveguide 11 may be selected to satisfy a condition in which the optical confinement factor (OCF) in the optical waveguide 11 is, for example, about 50% or more and the OCF in the compound semiconductor layer 12 is, for example, about 3% or more.

FIGS. 3A to 5B are tables showing simulation results for optimizing the width W2 and the height T2 of the optical waveguide 11 disposed under the light source or the optical amplifier 10 under various conditions. In FIGS. 3A to 5B, assuming that the compound semiconductor layer 12 has eight multi-quantum well structures and has a p-type separate confinement heterostructure (PSCH) having a thickness of 250 nm, a simulation was performed to obtain the optimal width W2 and the height T2 of the optical waveguide 11 according to a structure of the optical waveguide 11 and the thickness of the n-type separate confinement heterostructure (NSCH).

First, tables of FIGS. 3A and 3B show optical confinement factors in the compound semiconductor layer 12 and optical confinement factors in the optical waveguide 11 when the optical waveguide 11 disposed under the light source or the optical amplifier 10 is a channel waveguide and the compound semiconductor layer 12 of the light source or the optical amplifier 10 has an NSCH having a thickness of 50 nm. The simulation was performed while changing the height T2 of the optical waveguide 11 to 200 nm, 300 nm, 400 nm, 500 nm, 600 nm, and 700 nm, and the width W2 of the optical waveguide 11 to 0.5 µm, 0.75 µm, 1 µm, 1.25 µm, and 1.5 µm.

Referring to the table of FIG. 3A, as the width W2 and the height T2 of the optical waveguide 11 decrease, the optical confinement factor in the compound semiconductor layer 12 increases, and as the width W2 and the height T2 of the optical waveguide 11 increase, the optical confinement factor in the compound semiconductor layer 12 decreases. Also, referring to the table of FIG. 3B, as the width W2 and the height T2 of the optical waveguide 11 decrease, the light confinement factor in the optical waveguide 11 decreases, and as the width W2 and the height T2 of the optical waveguide 11 increase, the light confinement factor in the optical waveguide 11 increases. It may be seen that, to satisfy a condition that optical confinement factor in the compound semiconductor layer 12 is 3% or more and the optical confinement factor in the optical waveguide 11 is 50% or more, the width W2 and the height T2 of the optical waveguide 11 respectively are 0.75 µm and 400 nm.

Also, FIGS. 4A and 4B are tables respectively showing optical confinement factors in the compound semiconductor layer 12 and optical confinement factors in the optical waveguide 11 when the optical waveguide 11 disposed under a light source or an optical amplifier 10 is a rib waveguide and the compound semiconductor layer 12 of the light source or the optical amplifier 10 does not have an NSCH. Referring to FIGS. 4A and 4B, in this case, it may be seen that, to satisfy a condition that the optical confinement factor in the compound semiconductor layer 12 is 3% or more and the optical confinement factor in the optical waveguide 11 is 50% or more, the width W2 of the optical waveguide 11 is 0.75 µm, 1 µm, 1.25 µm, and 1.5 µm and the height T2 is 400 nm.

Also, FIGS. 5A and 5B are tables respectively showing optical confinement factors in the compound semiconductor layer 12 and optical confinement factors in the optical waveguide 11 when the optical waveguide 11 disposed under the light source or an optical amplifier 10 is a rib waveguide and the compound semiconductor layer 12 of the light source or the optical amplifier 10 has an NSCH having a thickness of 100 nm. Referring to FIGS. 5A and 5B, in this case, it may be seen that, to satisfy a condition that the optical confinement factor in the compound semiconductor layer 12 is 3% or more and the optical confinement factor in the optical waveguide 11 is 50% or more, the width W2 of the optical waveguide 11 is 0.75 µm and the height T2 is 400 nm.

Figure 6:
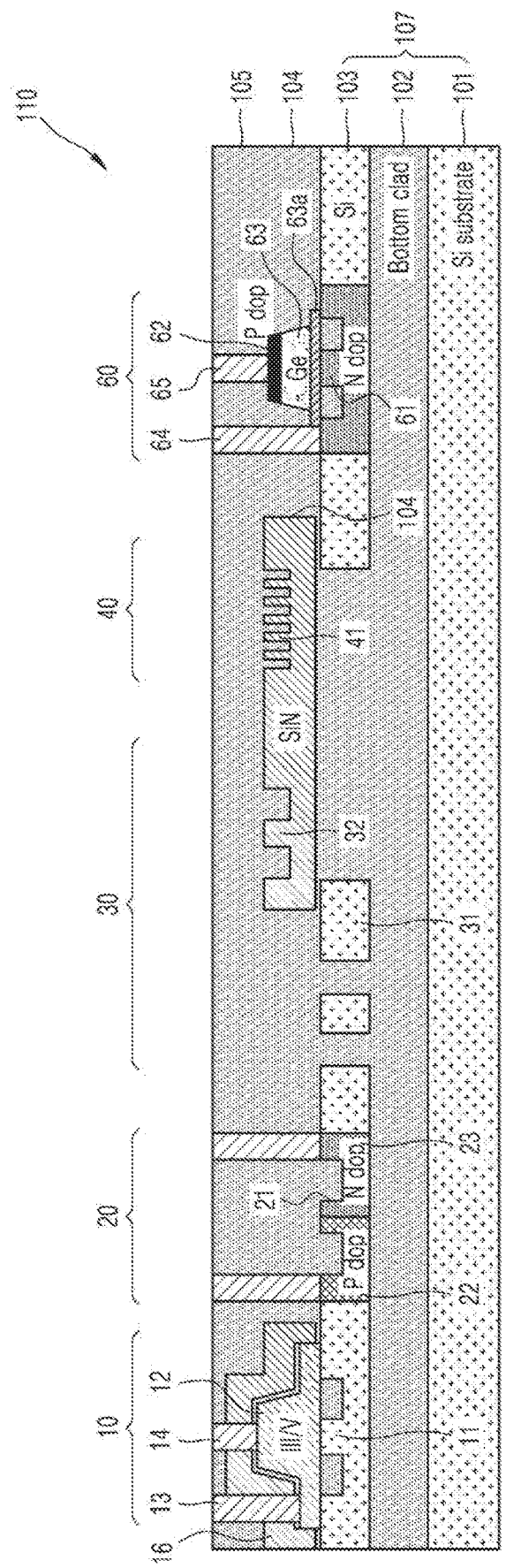
FIG. 6 is a schematic cross-sectional view of another example configuration of a photonic integrated circuit platform and an optical integrated circuit, according to embodiments.

FIG. 6 is a schematic cross-sectional view of another example configuration of a photonic integrated circuit platform 110 and an optical integrated circuit, according to embodiments. Referring to FIG. 6, a second optical element layer 104 of the photonic integrated circuit platform 110 according to the present embodiment may further include germanium (Ge) as a semiconductor material in addition to the compound semiconductor and silicon nitride. For example, an optical integrated circuit manufactured by using the photonic integrated circuit platform 110 shown in FIG. 6 may include a photodetector 60 including germanium (Ge) instead of the photodetector 50 (refer to FIG. 1) including a compound semiconductor. The structure of the photonic integrated circuit platform 110 shown in FIG. 6 may be almost the same as that of the photonic integrated circuit platform 100 shown in FIG. 1 except for the photodetector 60.

The photodetector 60 may include, for example, a first doping region 61 in the first optical element layer 103, a germanium layer 63 formed on the first doping region 61 in the second optical element layer 104, a second doping region 62 on the germanium layer 63, and conductive plugs 64 and 65 formed by vertically penetrating through the second oxide layer 105. The first doping region 61 may be formed by doping silicon of the first optical element layer 103 with an impurity, and the second doping region 62 may be formed by doping the germanium layer 63 with an impurity. The first doping region 61 and the second doping region 62 may be doped to have opposite electrical characteristics. For example, the first doping region 61 may be doped in a p-type and the second doping region 62 may be doped in an n-type, or the first doping region 61 may be doped in an n-type and the second doping region 62 may be doped in a p-type. One of the conductive plugs 64 and 65 may be electrically connected to the first doping region 61 and the other to the second doping region 62. Also, silicon of the first doping region 61 may be partially patterned. Then, the first doping region 61 may also perform as an optical waveguide.

The germanium layer 63 may have a thickness in a range from about 200 nm to about 1,000 nm. Also, the germanium layer 63 may be patterned in a ridge shape by etching about 20% to about 80% of the total thickness of both edges of the germanium layer 63. Also, a SiGe layer 63a including a mixture of silicon (Si) and germanium (Ge) may be further disposed at an interface between a lower surface of the germanium layer 63 and the first doping region 61. For example, the SiGe layer 63a may have a thickness in a range from about 0 nm to about 100 nm.

Also, on the photodetector 60, the upper clad 56 shown in FIG. 1 is omitted. Because the photodetector 60 does not generate much heat, the upper clad 56 may not be disposed on the photodetector 60. For this reason, the upper clad 56 may be omitted even on the photodetector 50 shown in FIG. 1. However, if it is necessary to further cool the photodetector 60, the upper clad 56 shown in FIG. 1 may be further disposed on the photodetector 60.

In the photonic integrated circuit platform 110 shown in FIG. 6, the compound semiconductor layer 12 of the light source or the optical amplifier 10, the second optical waveguide 32 of the optical waveguide 30, the optical coupler 40, and the germanium layer 63 of the photodetector 60 may be disposed at the same layer height in the second optical element layer 104.

Figure 7:
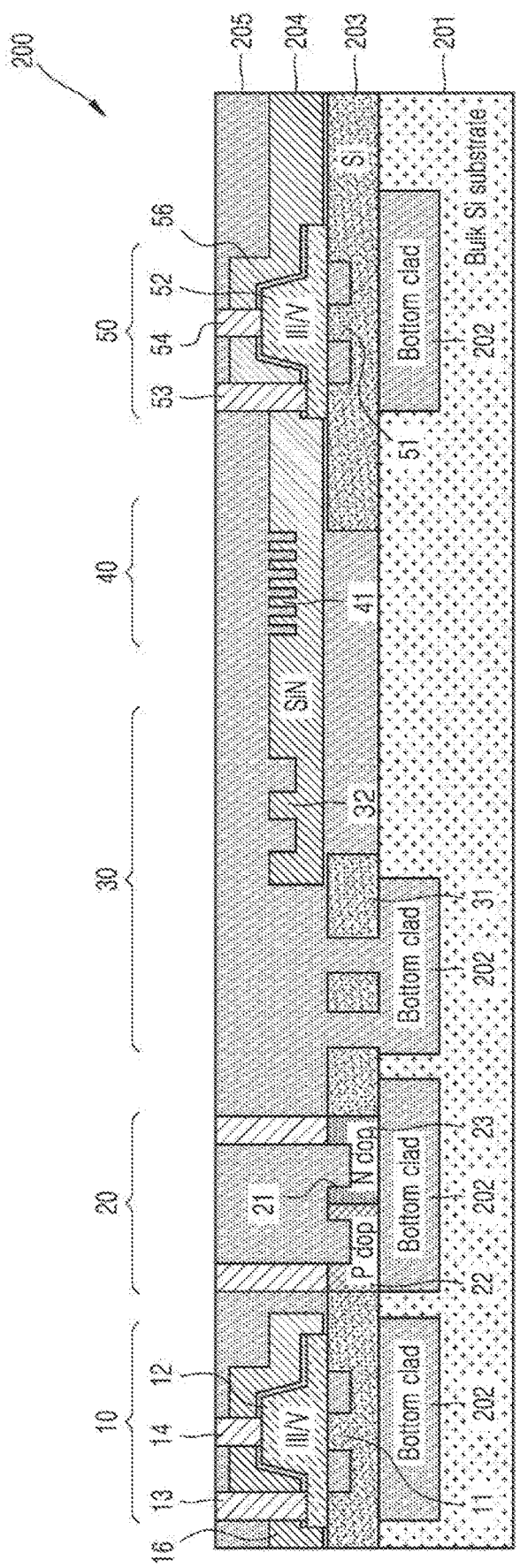
FIG. 7 is a schematic cross-sectional view of another example configuration of a photonic integrated circuit platform and an optical integrated circuit, according to embodiments.

FIG. 7 is a schematic cross-sectional view of another example configuration of a photonic integrated circuit platform 200 and an optical integrated circuit, according to embodiments. In the photonic integrated circuit platforms 100 and 110 shown in FIGS. 1 and 6, the first oxide layer 102 performing as a lower clad is disposed over an entire upper surface of the substrate 101. Also, the substrate 101, the first oxide layer 102, and the first optical element layer 103 may be formed of one SOI substrate 107. However, the photonic integrated circuit platform 200 shown in FIG. 7 may include a bulk silicon substrate 201 instead of the SOI substrate 107. Also, the photonic integrated circuit platform 200 may include a first oxide layer 202 locally disposed on the bulk silicon substrate 201. For example, an upper surface of the bulk silicon substrate 201 may be locally etched and the locally etched upper surface of the bulk silicon substrate 201, which is etched, is filled with an oxide material of the first oxide layer 202.

A first optical element layer 203 having partially crystallized poly-Si formed by a solid-phase epitaxy (SPE) process may be disposed on the first oxide layer 202. Various optical elements may be implemented by processing polysilicon of the first optical element layer 203. The first oxide layer 202 may be disposed to face only a lower part of an optical element formed in the first optical element layer 203. For example, each of the first oxide layers 202 may be disposed on the substrate 201 to face a lower part of the light source or the optical amplifier 10, the optical modulator 20, the optical waveguide 30, and the photodetector 50 formed in the first optical element layer 203. When compared to the configuration of the photonic integrated circuit platform 100 in which the first oxide layer 102 is disposed over the entire surface of the substrate 101, the structure having the localized first oxide layer 202 increases the heat dissipation efficiency to the bulk silicon substrate 201, thereby improving the characteristics of an optical element that is sensitive to heat.

The photonic integrated circuit platform 200 also may further include a second optical element layer 204 on the first optical element layer 203 and a second oxide layer 205 on the second optical element layer 204. The second optical element layer 204 has the same configuration as the second optical element layer 104 shown in FIG. 1, and the second oxide layer 205 has the same configuration as the second oxide layer 105 shown in FIG. 1, and therefore, detailed descriptions thereof may be omitted.

Figure 8:
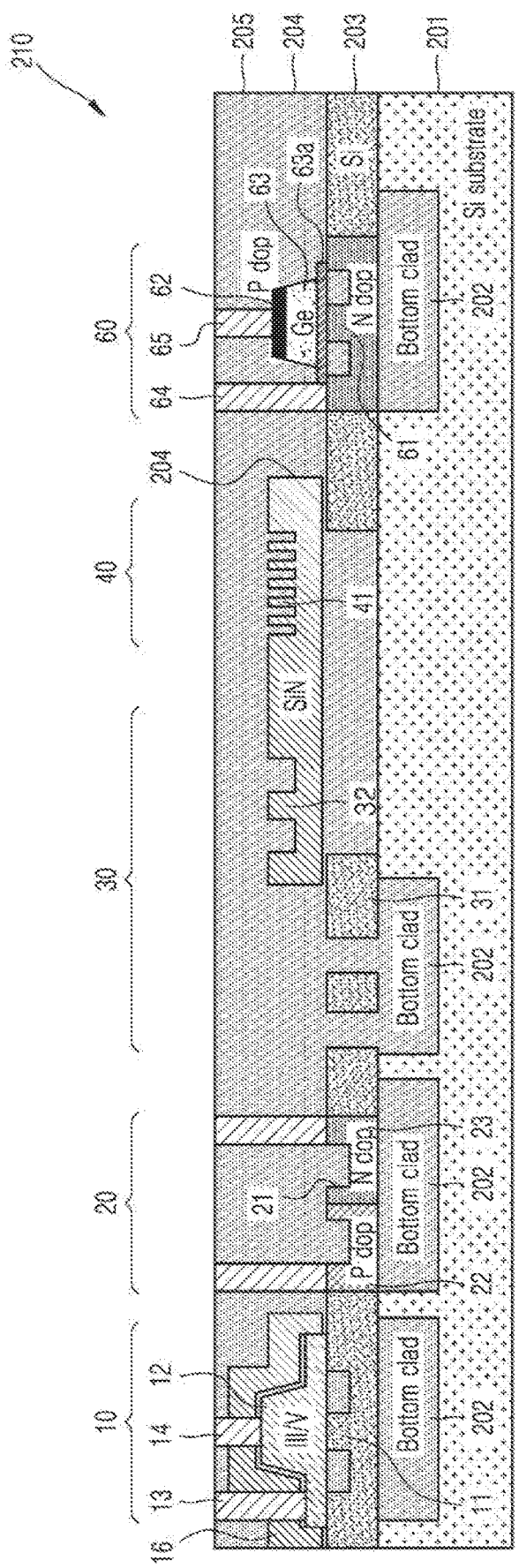
FIG. 8 is a schematic cross-sectional view of another example configuration of a photonic integrated circuit platform and an optical integrated circuit, according to embodiments.

FIG. 8 is a schematic cross-sectional view of another example configuration of a photonic integrated circuit platform 210 and an optical integrated circuit, according to embodiments. Referring to FIG. 8, the second optical element layer 204 of the photonic integrated circuit platform 210 according to the present embodiment may further include germanium (Ge) as a semiconductor material in addition to a compound semiconductor and silicon nitride. For example, an optical integrated circuit manufactured by using the photonic integrated circuit platform 210 shown in FIG. 8 may include a photodetector 60 including germanium (Ge) instead of the photodetector 50 (refer to FIG. 7) including a compound semiconductor. The structure of the photonic integrated circuit platform 210 shown in FIG. 8 may be almost the same as the structure of the photonic integrated circuit platform 200 shown in FIG. 7 except for the photodetector 60. Also, the structure of the photodetector 60 may be the same as that of the photodetector 60 described with reference to FIG. 6.

Figure 9:
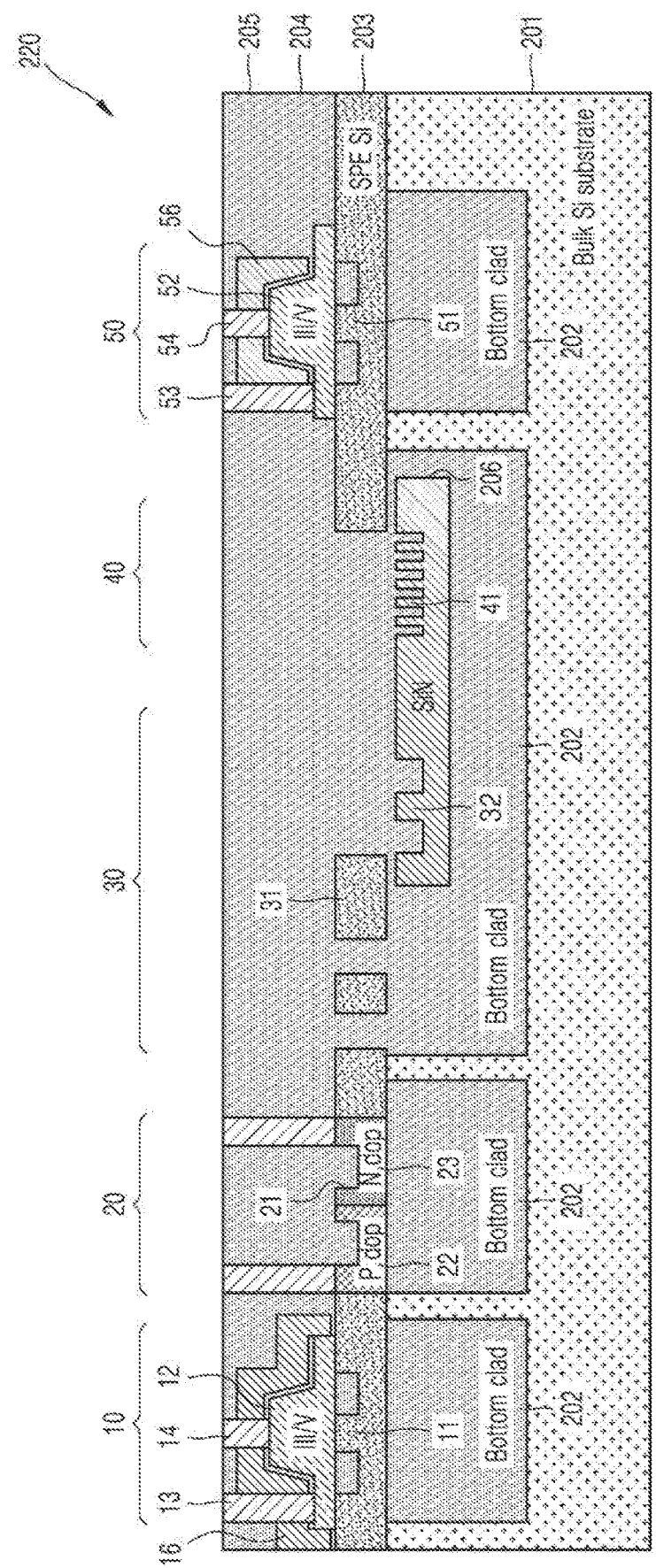
FIG. 9 is a schematic cross-sectional view of another example configuration of a photonic integrated circuit platform and an optical integrated circuit, according to embodiments.

FIG. 9 is a schematic cross-sectional view of an example configuration of a photonic integrated circuit platform 220 and an optical integrated circuit, according to embodiments. Referring to FIG. 9, the photonic integrated circuit platform 220 according to the present embodiment has a difference from the photonic integrated circuit platforms 200 and 210 shown in FIGS. 7 and 8 in that the photonic integrated circuit platform 220 further includes a third optical element layer 206 inside the first oxide layer 202. The third optical element layer 206 may include, for example, a second optical waveguide 32 and an optical coupler 40 that include silicon nitride. The second optical element layer 204 does not include the second optical waveguide 32 and the optical coupler 40 shown in FIGS. 7 and 8. Accordingly, the second optical waveguide 32 and the optical coupler 40 are disposed below the first optical element layer 203. When the third optical element layer 206 including silicon nitride is disposed inside the first oxide layer 202, because the second optical element layer 204 does not include silicon nitride disposed at the same height as the compound semiconductor layers 12 and 52, a process of forming the compound semiconductor layers 12 and 52 on the first optical element layer 203 may be simplified. The rest of the configuration of the photonic integrated circuit platform 220 except for the configuration described above is the same as the configuration of the photonic integrated circuit platform 200 shown in FIG. 6.

Figure 10:
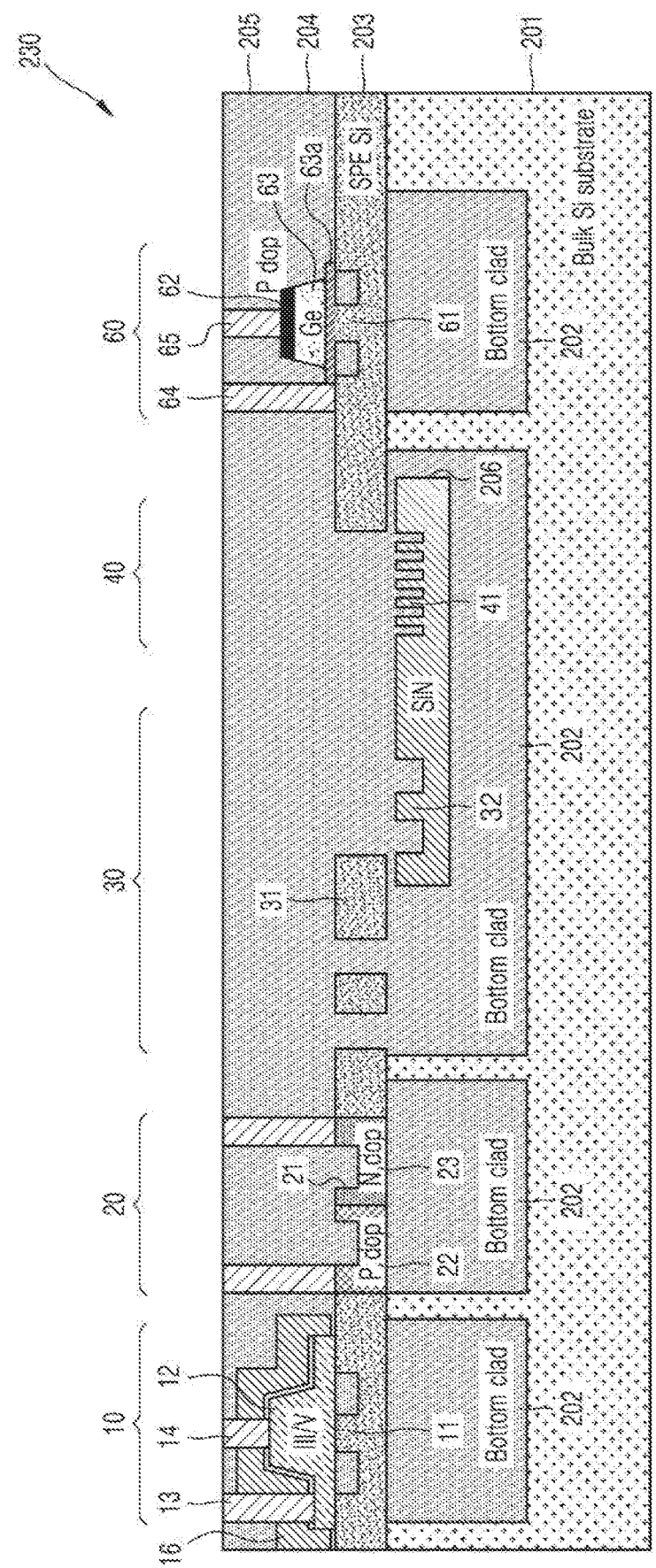
FIG. 10 is a schematic cross-sectional view of another example configuration of a photonic integrated circuit platform and an optical integrated circuit, according to embodiments.

FIG. 10 is a schematic cross-sectional view of another example configuration of a photonic integrated circuit platform 230 and an optical integrated circuit, according to embodiments. Referring to FIG. 10, the photonic integrated circuit platform 230 according to the present embodiment has almost the same configuration as the photonic integrated circuit platform 220 shown in FIG. 9 except for the photodetector 60. For example, the optical integrated circuit manufactured by using the photonic integrated circuit platform 230 shown in FIG. 10 may include a photodetector 60 including germanium (Ge) instead of the photodetector 50 including a compound semiconductor. The structure of the photodetector 60 is the same as that of the photodetector 60 described with reference to FIG. 6.

Figure 11:
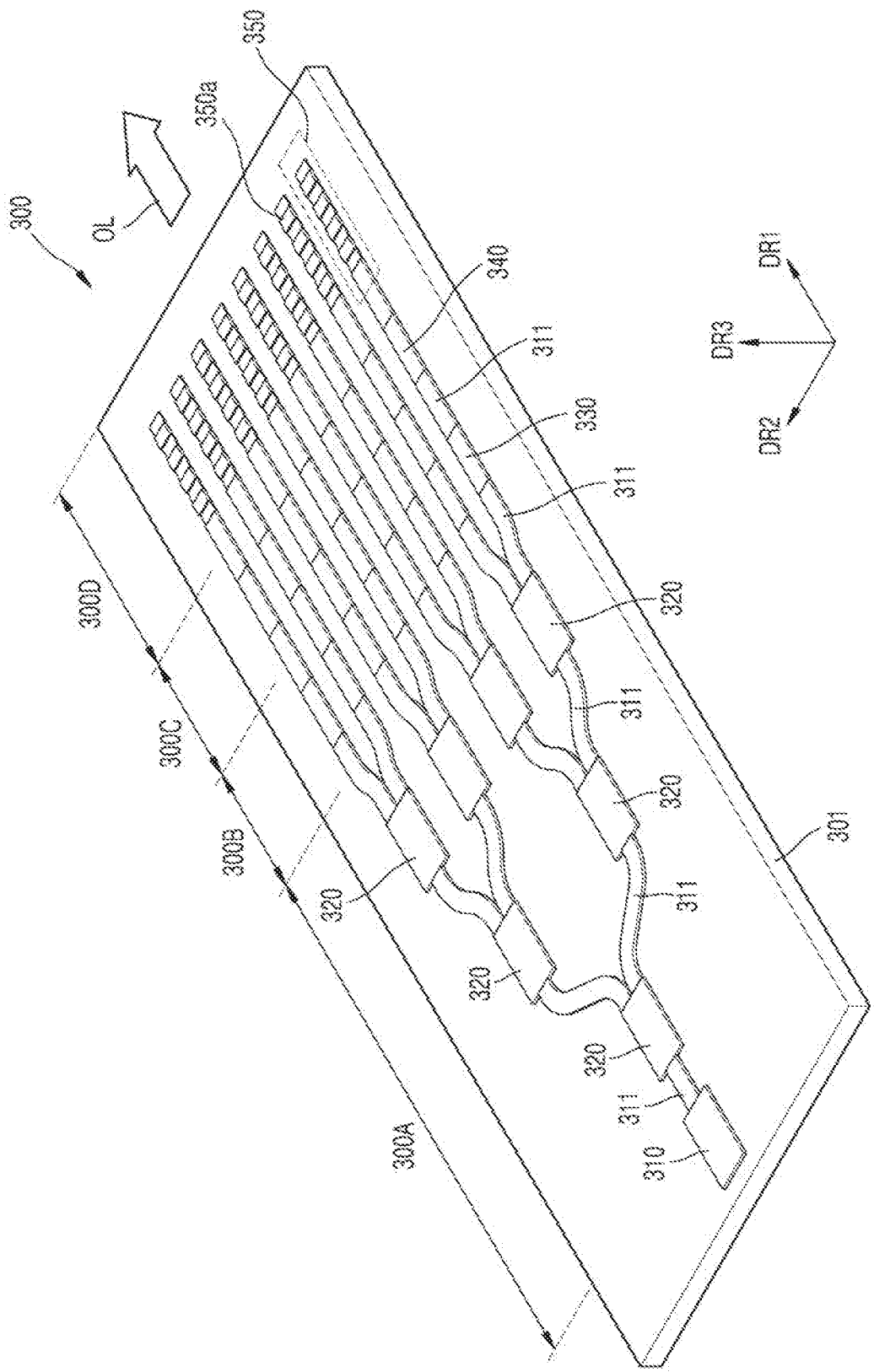
FIG. 11 is a schematic perspective view of an example configuration of an optical phased array device manufactured using a photonic integrated circuit platform, according to embodiments.

As described above, various optical integrated circuits may be manufactured through a single process by using the photonic integrated circuit platform 230. For example, FIG. 11 is a schematic perspective view of an example configuration of an optical phased array device 300 manufactured using a photonic integrated circuit platform, according to embodiments. Referring to FIG. 11, the optical phased array device 300 may include a light source 310 on a substrate 301, a branch region 300A, a phase control region 300B, an amplifying region 300C, and an emission region 300D. The light source 310, the branch region 300A, the phase control region 300B, the amplifying region 300C, and the emission region 300D may be arranged in a first direction DR1. Also, the optical phased array device 300 may include a plurality of optical waveguides 311 to sequentially transmit light generated from the light source 310 to the branch region 300A, the phase control region 300B, the amplifying region 300C, and the emission region 300D. Light generated from the light source 310 may travel in the first direction DR1 through the optical waveguides 311.

The branch region 300A may include a plurality of optical splitters 320. The plurality of optical splitters 320 may split one light traveling along the optical waveguide 311 into several pieces of light. To this end, one optical waveguide 311 may be connected to an input terminal of each optical splitter 320 and a plurality of optical waveguides 311 may be connected to an output terminal of each optical splitter 320. As an example, a plurality of optical splitters 320 that split one light into two pieces of light is illustrated in FIG. 11. Light generated from the light source 310 may be split into a plurality of pieces of light in the branch region 300A. The split pieces of light proceed along the plurality of optical waveguides 311, respectively. In FIG. 11, it is depicted that light generated from the light source 310 is split into eight pieces of light in the branch region 300A, but this is an example and is not necessarily limited thereto.

The phase control region 300B may include a plurality of phase control elements 330 respectively disposed in the plurality of optical waveguides 311. For example, the plurality of phase control elements 330 may be arranged in a second direction DR2 perpendicular to the first direction DR1. The plurality of pieces of light split in the branch region 300A may be respectively provided to the plurality of phase control elements 330. The phase control element 330 may have a variable refractive index that is electrically controlled. Phases of the light passing through the phase control element 330 may be determined according to the refractive index of the phase control element 330. The phase control element 330 may independently control the phases of the split pieces of light.

The amplifying region 300C may include a plurality of optical amplifiers 340 respectively disposed in the plurality of optical waveguides 311. The plurality of optical amplifiers 340 may be arranged in the second direction DR2 perpendicular to the first direction DR1. The optical amplifiers 340 may increase the intensity of an optical signal. For example, each of the optical amplifiers 340 may include a semiconductor optical amplifier or an ion doping amplifier.

The emission region 300D may include a plurality of grating pattern groups 350. The plurality of grating pattern groups 350 may be arranged in the second direction DR2. The plurality of grating pattern groups 350 may be respectively connected to the plurality of optical amplifiers 340. Each of the grating pattern groups 350 respectively may emit light amplified in the amplifying region 300C. To this end, each of the grating pattern groups 350 may include a plurality of grating patterns 350a that are periodically arranged. The plurality of grating patterns 350a may be arranged in the first direction DR1. The traveling direction of output light OL emitted by the grating pattern group 350 may be determined by a phase difference between split light determined in the phase control region 300B, a gap between the grating patterns 350a, a height of the grating patterns 350a, and a width of the grating patterns 350a. For example, the traveling direction of the output light OL may have a component in the first direction DR1, a component in the second direction DR2, and a component in the direction DR3 perpendicular to the first direction DR1 and the second direction DR2.

Figure 12:
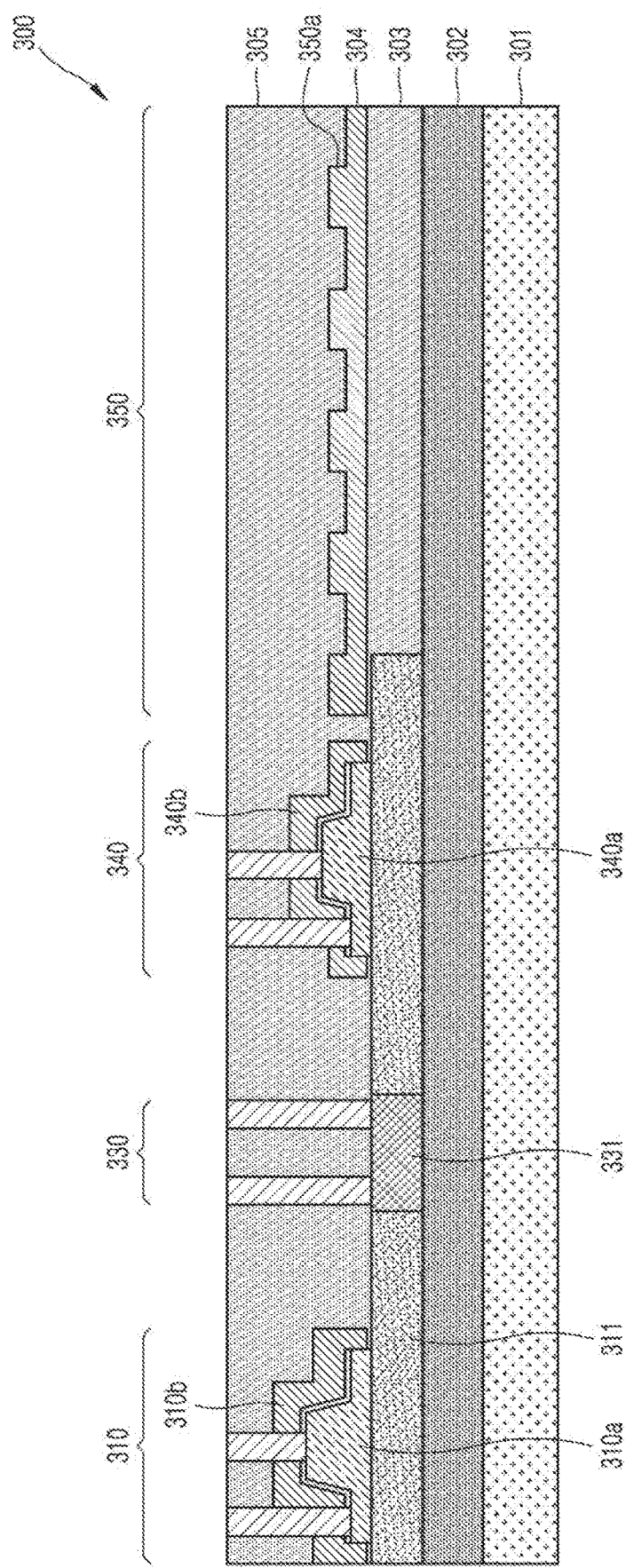
FIG. 12 is a schematic cross-sectional view of an example configuration of the optical phased array device shown in FIG. 11.

FIG. 12 is a schematic cross-sectional view of an example configuration of the optical phased array device 300 shown in FIG. 11. The cross-sectional view of FIG. 12 is a cross-section of the optical phased array device 300 in the third direction DR3 along any one of the optical waveguides 311 shown in FIG. 11. Referring to FIG. 12, the optical phased array device 300 may include: a substrate 301; a first oxide layer 302 including an oxide material on the substrate 301; a first optical element layer 303 including a semiconductor material on the first oxide layer 302; a second optical element layer 304 including a material different from those of the first oxide layer 302 and the first optical element layer 303 on the first optical element layer 303; and a second oxide layer 305 including an oxide material on the second optical element layer 304.

As described above, the substrate 301 may include, for example, a silicon substrate. The first oxide layer 302 may include, for example, silicon oxide ($SiO_2$), but is not limited thereto. The first optical element layer 303 may include, for example, crystalline silicon (c-Si). A plurality of optical waveguides 311 may be formed on the first optical element layer 303. In the cross-sectional view of FIG. 12, although not clearly distinguished from the optical waveguides 311, a plurality of optical splitters 320 may be formed between the optical waveguides 311 in the first optical element layer 303. Also, a plurality of phase control elements 330 may be disposed on the first optical element layer 303. Each of the phase control elements 330 may include a refractive index change layer 331, wherein the refractive index thereof is changed by electrical control. The refractive index change layer 331 may be between the optical waveguides 311. Accordingly, the plurality of optical waveguides 311, a branch region 300A, and a phase control region 300B may be formed in the first optical element layer 303.

A light source 310, a plurality of optical amplifiers 340, and a plurality of grating pattern groups 350 may be formed on the second optical element layer 304. Accordingly, the light source 310, the amplifying region 300C, and the emission region 300D may be formed in the second optical element layer 304. For example, the light source 310 and the optical amplifier 340 may respectively include active layers 310a and 340a including a Group III/V compound semiconductor, a group II/VI compound semiconductor, or germanium (Ge) different from the semiconductor material of the first optical element layer 303. However, the present embodiment is not limited thereto, and a light source and a photodetector may be formed by patterning and doping crystalline silicon of the first optical element layer 303. In this case, the light source and the photodetector are formed on the first optical element layer 303.

Each of the grating pattern groups 350 includes a plurality of grating patterns 350*a*. The grating pattern group 350 may include an insulating material having less light loss and greater thermal conductivity than the oxide of the first oxide layer 302. For example, the grating pattern group 350 may include silicon nitride (SiN). The grating pattern group 350 is disposed above the optical waveguides 311 formed in the first optical element layer 303. For optical connection between the optical waveguide 311 and the grating pattern group 350, a portion of the optical waveguide 311 and a portion of the grating pattern group 350 may be disposed to overlap each other in the top view of the optical phased array device 300. Also, in a region where the optical waveguide 311 and the grating pattern group 350 face each other, a distance between the optical waveguide 311 and the grating pattern group 350 is in a range from about 0 to about 200 nm. In this case, a vertical evanescent coupling occurs in the regions where the optical waveguide 311 and the grating pattern group 350 face each other, and thus, light may be transmitted between the optical waveguide 311 and the grating pattern group 350 with almost no loss of light. A gap between the optical waveguide 311 and the grating pattern group 350 may be filled with an oxide material constituting the first oxide layer 302. Because the grating pattern group 350 of the emission region 300D includes a material having low light loss, the light utilization efficiency of the optical phased array device 300 may be improved.

Also, upper clads 310*b* and 340*b* including the same material as the material of the grating pattern group 350 may be respectively disposed on the light source 310 and the optical amplifier 340. Because the upper clads 310*b* and 340*b* including a material having greater heat dissipation efficiency than the material of the first and second oxide layers 302 and 305 are respectively disposed on the light source 310 and the optical amplifier 340, the light source 310 and the optical amplifier 340 may be effectively cooled, and the light source 310 and the optical amplifier 340 may be prevented from being deteriorated by heat.

In FIG. 12, it is depicted that the optical phased array device 300 is manufactured using the photonic integrated circuit platform 100 shown in FIG. 1, but is not limited thereto. For example, it is also possible to manufacture the optical phased array device 300 using the photonic integrated circuit platforms 110, 200, 210, 220, and 230 according to another embodiment.

The photonic integrated circuit platform described above and the optical phased array device using the same have been described with reference to the embodiment shown in the drawings, but it may be understood by those skilled in the art that the embodiments of the inventive concept are capable of various modifications and may be embodied in many different forms. The embodiments may be considered in descriptive sense only and not for purposes of limitation. The scope of the inventive concept is defined not by the detailed description of the inventive concept but by the appended claims, and all differences within the scope will be construed as being included in the inventive concept.

It may be understood that embodiments described herein may be considered in a descriptive sense only and not for purposes of limitation. Descriptions of features or aspects within each embodiment may be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A photonic integrated circuit platform comprising:
a substrate;
a first oxide layer disposed on the substrate and comprising an insulating transparent oxide;
a first optical element layer disposed on the first oxide layer and comprising a semiconductor material;
a second optical element layer disposed on the first optical element layer and comprising an insulating material different from the insulating transparent oxide of the first oxide layer, the second optical element layer further comprising a compound semiconductor material different from the semiconductor material of the first optical element layer;
a second oxide layer disposed on the second optical element layer and comprising an insulating transparent oxide; and
a plurality of optical elements formed by patterning the first optical element layer or the second optical element layer,
wherein the plurality of optical elements comprises at least one of a light source or optical amplifier,
wherein the light source or the optical amplifier comprises:
an optical waveguide formed by patterning the semiconductor material of the first optical element layer;
a compound semiconductor layer formed by patterning the compound semiconductor material of the second optical element layer on the optical waveguide;
conductive plugs disposed vertically through the second oxide layer; and
an upper clad disposed to surround an upper portion of the compound semiconductor layer, and
wherein the upper clad comprises the insulating material of the second optical element layer.

2. The photonic integrated circuit platform of claim 1, wherein the substrate comprises silicon,
the insulating transparent oxide of the first oxide layer comprises silicon oxide stacked over an entire upper surface of the substrate,
the semiconductor material of the first optical element layer comprises silicon, and
the insulating material of the second optical element layer comprises silicon nitride.

3. The photonic integrated circuit platform of claim 1, wherein the substrate comprises a bulk silicon substrate, and
the insulating transparent oxide of the first oxide layer comprises silicon oxide locally disposed on the substrate so that the silicon oxide faces a lower part of one among the plurality of optical elements that is disposed in the first optical element layer.

4. The photonic integrated circuit platform of claim 3, further comprising a third optical element layer comprising at least one optical element comprising silicon nitride and disposed inside the first oxide layer.

5. The photonic integrated circuit platform of claim 4, wherein the at least one optical element comprises an optical waveguide and an optical coupler that are disposed under the first optical element layer.

6. The photonic integrated circuit platform of claim 1, wherein the plurality of optical elements further comprises any one or any combination of an optical modulator, an optical waveguide, an optical coupler, and a photodetector.

7. The photonic integrated circuit platform of claim 1, wherein the semiconductor material of the first optical element layer has a thickness in a range from about 150 nm to about 1,000 nm, and the optical waveguide is formed by partially etching and patterning 1% to 80% of the thickness of the semiconductor material.

8. The photonic integrated circuit platform of claim 1, wherein a distance between the semiconductor material of the first optical element layer and the compound semiconductor layer of the second optical element layer is in a range from about 0 nm to about 10 nm.

9. The photonic integrated circuit platform of claim 1, wherein the optical waveguide comprises:
  a first optical waveguide formed by patterning the semiconductor material of the first optical element layer; and
  a second optical waveguide formed by patterning the insulating material of the second optical element layer.

10. The photonic integrated circuit platform of claim 9, wherein a thickness of the insulating material of the second optical element layer forming the second optical waveguide is in a range from about 150 nm to about 1,000 nm, and
  the second optical waveguide is formed by partially etching and patterning 1% to 80% of the thickness of the insulating material of the second optical element layer.

11. The photonic integrated circuit platform of claim 9, wherein, in a top view of the photonic integrated circuit platform, a portion of the first optical waveguide overlaps a portion of the second optical waveguide,
  a distance between the first optical waveguide and the second optical waveguide is in a range from about 0 nm to about 200 nm so that a vertical evanescent coupling occurs in a region where the first optical waveguide and the second optical waveguide face each other, and
  the insulating transparent oxide of the first oxide layer is filled between the first optical waveguide and the second optical waveguide.

12. The photonic integrated circuit platform of claim 9, wherein the optical coupler comprises a form of a periodic grating formed by patterning the insulating material of the second optical element layer, and is integrally formed with the second optical waveguide.

13. The photonic integrated circuit platform of claim 12, wherein the photodetector comprises:
  an optical waveguide formed by patterning the semiconductor material of the first optical element layer;
  a compound semiconductor layer formed by patterning the compound semiconductor material of the second optical element layer on the optical waveguide; and
  conductive plugs disposed vertically through the second oxide layer, and
  the compound semiconductor layer of the light source or the optical amplifier, the second optical waveguide, the optical coupler, and the compound semiconductor layer of the photodetector are disposed at a same layer height in the second optical element layer.

14. The photonic integrated circuit platform of claim 12, wherein the photodetector comprises:
  a first doping region formed by doping the semiconductor material of the first optical element layer;
  a germanium layer comprising germanium (Ge) in the second optical element layer on the first doping region; and
  a second doping region formed by doping the germanium layer.

15. The photonic integrated circuit platform of claim 14, wherein the photodetector further comprises a SiGe layer comprising a mixture of silicon (Si) and germanium (Ge) at an interface between a lower surface of the germanium layer and the first doping region.

16. The photonic integrated circuit platform of claim 14, wherein the compound semiconductor layer of the light source or the optical amplifier, the second optical waveguide, the optical coupler, and the germanium layer of the photodetector are disposed at a same layer height in the second optical element layer.

17. An optical phased array device comprising:
  a substrate;
  a first oxide layer disposed on the substrate and comprising an insulating transparent oxide;
  a first optical element layer disposed on the first oxide layer;
  a second optical element layer disposed on the first optical element layer; and
  a second oxide layer disposed on the second optical element layer,
  wherein the first optical element layer comprises:
    an optical waveguide comprising a semiconductor material;
    a branch region for splitting one light traveling along the optical waveguide, into pieces of light; and
    a phase control region for independently controlling phases of the split pieces of light, and
  the second optical element layer comprises:
    a light source comprising a compound semiconductor material different from the semiconductor material of the first optical element layer;
    an amplifying region for amplifying a magnitude of an optical signal; and
    an emission region for emitting the optical signal of which the magnitude is amplified.

18. The optical phased array device of claim 17, wherein the optical phased array device is configured to sequentially transmit light that is generated from the light source through the branch region, the phase control region, the amplifying region, and the emission region along the optical waveguide.

19. The optical phased array device of claim 18, wherein the branch region comprises a plurality of optical splitters, and
  each of the plurality of optical splitters comprises:
    an input terminal connected to one optical waveguide; and
    an output terminal connected to a plurality of optical waveguides.

20. The optical phased array device of claim 18, wherein the phase control region comprises a plurality of phase control elements that is disposed in a direction perpendicular to a traveling direction of the light, and
  the plurality of phase control elements independently controls a phase of the light.

21. The optical phased array device of claim 18, wherein the emission region comprises a plurality of grating pattern groups comprising an insulating material different from the insulating transparent oxide of the first oxide layer, and
  the plurality of grating pattern groups is disposed in a direction perpendicular to a travelling direction of the light.

22. The optical phased array device of claim 21, wherein, in a top view of the optical phased array device, a portion of the optical waveguide overlaps a portion of the plurality of grating pattern groups, and
  a distance between the optical waveguide and the plurality of grating pattern groups is in a range from about 0 to about 200 nm so that a vertical evanescent coupling occurs in a region where the optical waveguide and the plurality of grating pattern groups face each other.

\* \* \* \* \*